United States Patent [19]
Fox et al.

[11] Patent Number: 5,285,347
[45] Date of Patent: Feb. 8, 1994

[54] HYBIRD COOLING SYSTEM FOR ELECTRONIC COMPONENTS

[75] Inventors: Leslie Fox, Boxboro; Paul C. Wade, Shirley, both of Mass.

[73] Assignee: Digital Equipment Corporation, Maynard, Mass.

[21] Appl. No.: 830,952

[22] Filed: Feb. 6, 1992

Related U.S. Application Data

[63] Continuation of Ser. No. 547,722, Jul. 2, 1990, abandoned.

[51] Int. Cl.$^5$ ............................................. H05K 7/20
[52] U.S. Cl. .................................. 361/385; 165/80.3; 165/80.4; 361/695; 257/712; 257/714
[58] Field of Search ................. 165/80.3, 80.4, 80.5, 165/104.33, 104.34; 174/15.1, 15.2, 16.1, 16.3; 357/81, 82; 361/381, 382–389

[56] References Cited

U.S. PATENT DOCUMENTS

| | | | |
|---|---|---|---|
| 3,754,596 | 8/1973 | Ward, Jr. | 165/107 |
| 3,776,305 | 12/1973 | Simmons | 165/107 |
| 3,818,983 | 6/1974 | Grandia | 165/105 |
| 4,183,400 | 1/1980 | Seifert | 361/382 |
| 4,315,300 | 2/1982 | Parmerlee et al. | 361/382 |
| 4,498,118 | 2/1985 | Bell | 361/384 |
| 4,588,023 | 5/1986 | Manekawa | 361/385 |
| 4,635,709 | 1/1987 | Altoz | 165/32 |
| 4,646,202 | 2/1987 | Hook et al. | 361/382 |
| 4,712,158 | 12/1987 | Kikuchi et al. | 361/381 |
| 4,724,901 | 2/1988 | Manekawa | 361/385 |
| 4,793,405 | 12/1988 | Diggelmann et al. | 361/385 |
| 4,930,570 | 6/1990 | Okayasu | 361/385 |

OTHER PUBLICATIONS

U.S. Patent Application 07/367,355 filed Jun. 16, 1989 by Novotny, "Closed-Cycle Expansion-Valve Impingement Cooling System".

U.S. Patent Application 07/367,369 filed Jun. 16, 1989 by Novotny, "Open-Cycle Expansion-Valve Air-Impingement Cooling Apparatus".

*Primary Examiner*—Gregory D. Thompson
*Attorney, Agent, or Firm*—Clayton L. Satow; Barry N. Young; Albert P. Cefalo

[57] ABSTRACT

An improved method for removing heat from electronic devices, such as computer modules, is described. A flow of gas, such as air, cools the components. The gas flow is sufficient to cool so called "hot" components to their maximum operating temperature, and to cool the other components to their normal operating range. A liquid cooling system is also provided to cool the "hot" components to their normal operating range.

12 Claims, 4 Drawing Sheets

HYBIRD COOLING SYSTEM FOR ELECTRONIC COMPONENTS

This is a continuation of copending application Ser. No. 07/547,722 filed on Jul. 2, 1990, now abandoned.

BACKGROUND OF THE INVENTION

This invention relates to a method and apparatus for cooling electronic components.

Modern electronic devices, such as computers, consist of electronic components mounted on circuit boards. When these electronic devices operate, they generate heat. This heat must be removed from the devices or they may malfunction or may even be damaged or destroyed.

Most electronic components have a range of temperature at which they are designed to operate, hereinafter referred to as "normal operating range". Devices operating in the normal operating range operate according to product specifications with regard to speed, time to failure, and the like. Most electronic components have a maximum operating temperature. Electronic components operating at a temperature above the normal operating range, but below the maximum operating temperature, perform the desired function, but operate in a degraded fashion; for example, they may operate more slowly, they may be less tolerant of voltage variations, they may be less tolerant of electrical "noise", or they may fail after a shorter than normal period of time.

One technique for removing heat is to cause a gas, such as air, to move across the surface of the electronic components, or across a heat sink which contacts the electronic component. However, due to their low densities, gases are limited in the amount of heat that they can remove from electronic components. Therefore, as the electronic components, such as integrated circuits, incorporate more and more circuits, and operate faster and faster, they may generate enough heat such that circulating gas is not sufficient to remove the heat generated by the electronic components.

An alternate method for removing heat is to cause a liquid to contact a heat sink which contacts the electronic component. Because of their greater densities, moving liquids are capable of removing much greater amounts of heat than gases, but they involve either immersing the entire circuit board in the cooling liquid, or plumbing systems to circulate the liquid to the electronic components, or both. These plumbing systems often contain mechanical elements such as pumps, which are prone to failure. The designer of a cooling system for electronic components must therefore choose between the greater cooling capacity of a liquid cooling system and the lower cost and simplicity of a gas or air cooling system. Immersing the entire circuit board in the cooling liquid limits the choice of cooling liquid, because the cooling liquid must be non-corrosive to the circuit board and all its components and non-conductive. In addition care must be taken so that the cooling liquid does not get contaminated.

A part of most modern gas and liquid cooling systems for electronic devices is a heat sink. A heat sink is a thermally conductive material, such as aluminum, in physical contact with at least one electronic component which generates the heat. The heat sink transmits the heat to a cooling liquid or gas, or to some heat transport mechanism such as a cold plate.

A heat sink is normally physically attached to the electronic component or components by some means such as a thermally conductive adhesive, prior to its attachment to the circuit board. It covers approximately the same surface area of the circuit board (often referred to as the "footprint") as that of the electronic component or components.

If an electronic component produces a large amount of heat relative to its surface area, it may be necessary to use a so-called "extended surface" heat sink. Some extended surface heat sinks have a surface area and footprint that is larger than the surface area and footprint of the electronic component or components with which it is in contact. This is disadvantageous, however, as the extended surface heat sink may take up space on a circuit board that the designer could use for other purposes. Alternatively, extended surface heat sinks with compact footprints are taller than normal heat sinks. This is disadvantageous because it affects how closely circuit boards can be positioned.

There are typically several heat sinks on a circuit board. Heat sinks are normally designed specifically for either liquid or gas cooling. A heat sink designed for gas cooling maximizes the surface area of the heat sink that is exposed to the cooling gas, within the physical constraint of the design of the electronic device. A heat sink designed for liquid cooling must include a method of containing the liquid.

Another part of some gas or liquid cooling systems for electronic devices is a cold plate. A cold plate is a thermally conductive material such as copper or aluminum. A cold plate may directly contact the electronic component or, more commonly, may contact a heat sink which is in direct contact with the component; however, it is not normally attached to the electronic component or the heat sink prior to the component being placed on the circuit board. A cold plate is typically much larger in at least one dimension than the electronic components, and cover a much larger surface area than any of the electronic components. As ordinarily used, there are rarely more than one or two cold plates on a circuit board.

A factor which complicates the designer's decision whether to use a liquid, air or gas cooling system is that different types of components generate different amounts of heat. For example, devices containing computer CPU (Central Processing Unit) logic integrated circuits typically produce much greater amounts of heat than components such as computer memory chips. Another example of a component that produces greater amounts of heat than other components is a power amplifier in a microwave communications or radar system. This may result in a so-called "hot spot" on the circuit board. Most circulating gas systems or gas convection systems provide cooling that is relatively uniform over the surface of the circuit board. They are generally not well adapted to concentrate cooling gas at a "hot spot".

An example of a system that is adapted to cooling "hot spots" is illustrated in Bell U.S. Pat. No. 4,498,118, issued Feb. 5, 1985. In Bell, a cooling module is slidably mounted in opposed guide rails between two circuit boards. In the cooling module are orifices, through which a pressurized cooling fluid is directed towards the components of the adjacent circuit boards. A system such as Bell would require that the pattern of orifices be specially designed for the pattern of components on each circuit board, which makes production of the cooling module relatively complicated and expensive. Redesign of the circuit board, or replacement of either circuit board with another circuit board would require redesign and replacement of the cooling module. The cooling module would take up space in the rack of a cabinet that might otherwise be occupied by another circuit board. Only one cooling fluid is utilized, and the fluid circulates across the surface of the heat sink.

Other examples of systems that are adapted to cooling "hot spots" are illustrated in two application for a U.S. Patent by Novotny, Ser. No. 367,355 and Ser. No. 367,369, co-pending with this application and assigned to the same assingee as is the present application. In the Novotny inventions, a fluid is directed to the components through expansion valves. Only one cooling fluid is utilized, and the fluid circulates across the surface of the heat sink.

Liquid cooling systems are well adapted to cooling "hot spots" if the cooling liquid can be circulated directly to the hot spot. However the liquid cooling system has a greater capacity than is necessary to cool the devices that produce lesser quantities of heat. This can result in an unnecessarily complicated and expensive cooling system.

Designers of electronic devices try to make the devices as "fail safe" as possible. This is done by minimizing the consequences of failure of a component. One technique is to avoid situations in which the failure of one component results in the failure of the entire device. Often failure of a component or set of components of a cooling system can cause the entire device to fail. For example if the device is a liquid cooled computer, and the pump in the liquid cooling systems fails, the components may rapidly overheat, which may cause an unplanned computer shutdown. A frequently used technique for minimizing the consequences of the failure of a component of the cooling system is to include redundant components. For example, in gas cooling systems, it is common practice to employ multiple fans to force the cooling gas across the electronic components.

Prevention of a sudden failure is of particular interest in the computer art. If a computer experiences an unplanned shutdown, users may experience great inconvenience and expense. If a computer fails suddenly, valuable information can be irretrievably lost. However, if a potential failure can be detected and delayed a more graceful, planned shutdown can be performed. If the computer is a part of a computer network, the operations being performed by the failing computer may even be able to be transferred to another computer.

A cooling system may have two different methods of cooling the electronic components. For example, Altoz U.S. Pat. No. 4,635,709, entitled "Dual Mode Heat Exchanger" and issued Jan. 13, 1987 has a cooling system which circulates ambient air over the electronic components in an aircraft pod. If the aircraft travels at sufficiently high speed, the so-called "ram effect" makes the surrounding air too warm for effective cooling. For that situation, Altoz provides a second cooling method which uses evaporative cooling. In the evaporative cooling method, heat is transferred to a liquid which evaporates and is exhausted through a hydrophobic filter membrane. Systems such as Altoz which utilize both liquid and gas cooling techniques are often referred to as "hybrid" cooling systems.

A second example of a hybrid cooling system is described in Parmerlee et al. U.S. Pat. No. 4,315,300, entitled "Cooling Arrangement for Plug-in Module Assembly" and issued Feb. 9, 1982. In Parmerlee, et al., each heat generating module has a metallic heat plate which facilitates the transfer of heat from the electronic components to the parallel metallic sides which support the modules. Each parallel side is provided with fluid passageways for carrying a cooling liquid for removing heat transferred from the modules by way of the heat plate.

A key objective in Parmerlee et al. is to ensure that each module receives cool air at the same temperature of the air cooling the other modules. Thus, the liquid in Parmerlee is primarily concerned with providing cooling air of a temperature that is uniform from one module to another, but is not primarily concerned with cooling electronic components directly.

While Parmerlee et al. may achieve the objective of providing each module with cool air at the same temperature of the cooling air of the other modules, it is not as effective at cooling components directly. The amount of heat a cold plate can conduct is directly related to the cross sectional area of the cold plate. If it is necessary to increase the amount of heat conducted by the cold plate, the designer must make the cold plate wider or thicker. This may take up space on the circuit board and conflicts with the design goal of maximizing the number of electronic components on a circuit board.

Another characteristic of Parmerlee is that the heat transferred by the cold plate must travel across the circuit board for a long distance before it encounters the cooling liquid. In Parmerlee, the heat must travel through the cold plate to the edge of the circuit board to the parallel metallic sides to the cooling liquid. All cold plates have some thermal resistivity, which impedes the flow of heat and causes a temperature gradient, which decreases the efficiency of heat transfer.

While some of this disadvantage may be overcome by placing the electronic components that generate the most heat close to the parallel metallic sides, this conflicts with the design goal of placing electronic components according to functional rules, such as maximizing the speed at which the system operates.

SUMMARY OF THE INVENTION

The present invention provides an improved apparatus for cooling electronic devices.

A hybrid heat sink is specially adapted to transfer heat to two cooling fluids. This heat sink is incorporated into a cooling system in which some of the electronic components of an electronic device may be cooled by two cooling fluids and some electronic components may be cooled by one cooling fluid. The electronic components are mounted on a circuit board.

In the preferred embodiment of the invention, one of the cooling fluids is air and one is a liquid. The hybrid heat sink is attached to electronic components that cannot be cooled to the normal operating range by the cooling air alone. A system for circulating the cooling liquid to the hybrid heat sinks is also provided. The cooling air is caused to flow over the surface of the heat sink, removing some of the heat. In addition, the cooling liquid is caused to flow through the heat sink, thereby removing additional heat.

Conventional heat sinks may be attached to electronic components that can be cooled to the normal operating range by cooling air alone.

A further aspect of the preferred embodiment is that in the absence of the cooling liquid, the cooling air alone is sufficient to cool the electronic components which produce the greatest amount of heat to the maximum operating temperature or lower. The cooling air is further able to cool the remaining electronic components, which produce less heat, to the normal operating range.

Other features and advantages of the invention will be become apparent by reference to the following detailed descriptions when considered with the accompanying drawings.

DESCRIPTION OF THE INVENTION

Figure 1:
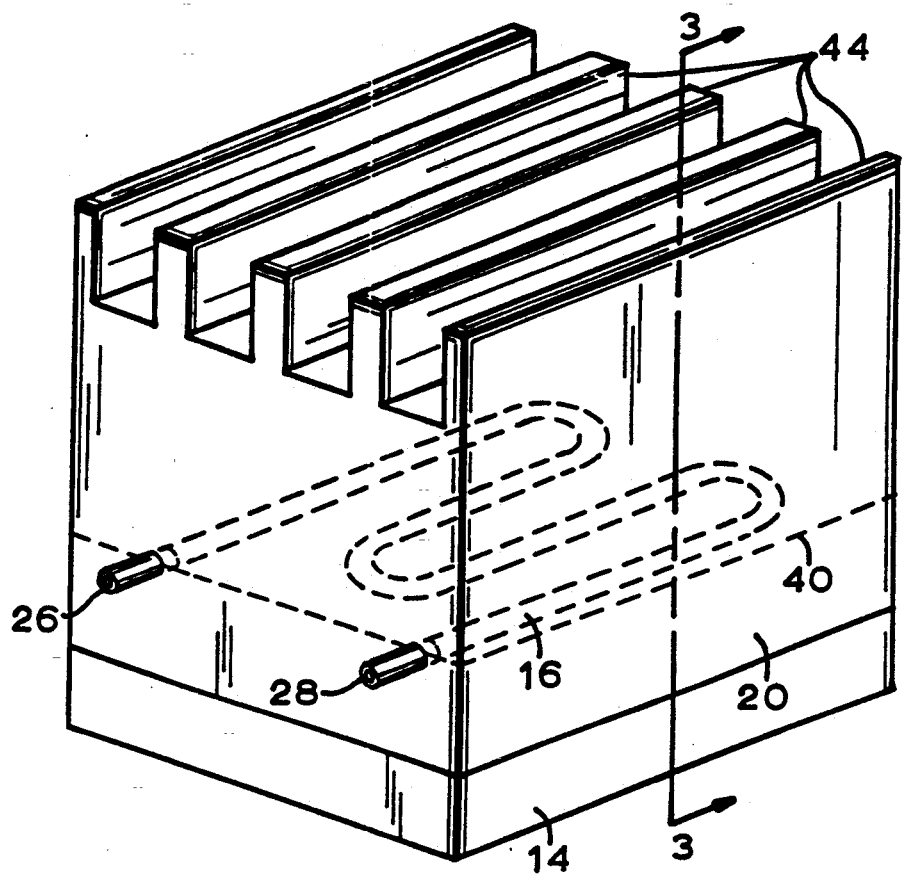
FIG. 1 is a perspective view of a hybrid heat sink in accordance with the invention.

Referring to FIG. 1, a hybrid heat sink 20 placed in direct physical contact with an electronic component 14 is shown. Hybrid heat sink 20 is made of a thermally conductive material such as aluminum. The hybrid heat sink 20 is generally block shaped and has a generally planar lower surface. Electronic component 14 is square or rectangular when viewed from the top, and has a generally planar upper surface. Hybrid heat sink 20 is shown as having the same length and width as the electronic component 14, but may be slightly wider or narrower. Fins 44 project from the face of the hybrid heat sink opposite the face that contacts the electronic component 14, thereby increasing the surface area of the hybrid heat sink that is exposed to the flow of a cooling gas, which flows in a direction parallel to the major axis of the fins 44.

A cavity 16 is in the interior of the hybrid heat sink 20. The cavity travels in a serpentine path in a plane that is parallel to the upper and lower surfaces of hybrid heat sink 14. Fittings 26 and 28 are physically attached to the inlet and outlet ports of cavity 16, and used to attach the cavity 16 to flexible tubing 24 (see FIGS. 4 and 5).

Hybrid heat sink 20 can be manufactured by a casting process. It may be appropriate to cast the hybrid heat sink 20 in two sections and join the sections along line 40 by a brazing or soldering process. Fittings 26 and 28 may be cast, or may be separate nipples joined to the hybrid heat sink by a press fit, or by a brazing, soldering, or welding process.

Figure 2:
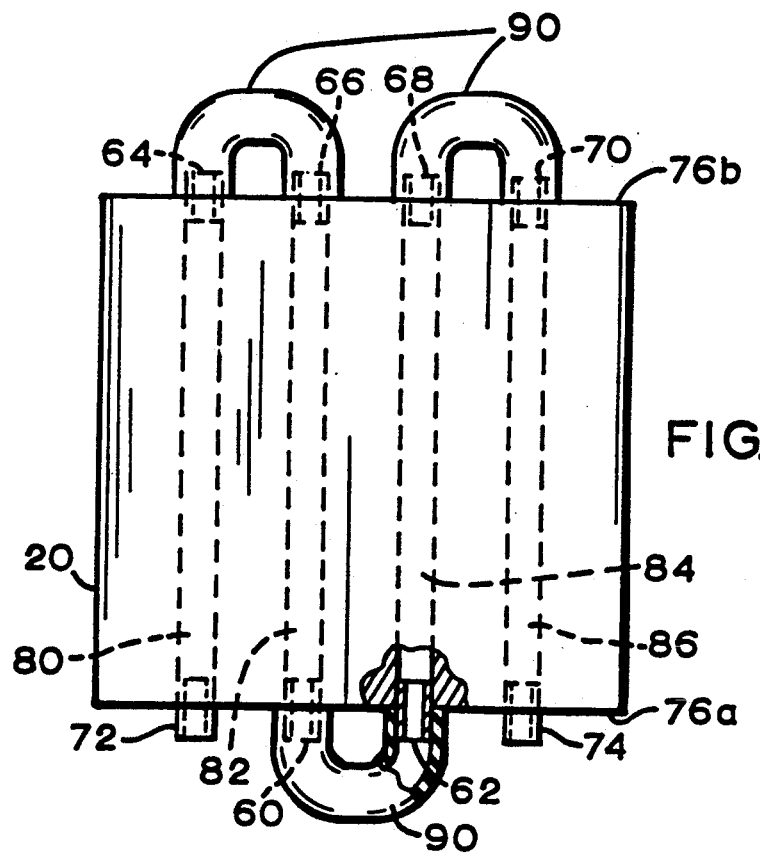
FIG. 2 is a top view of an alternate configuration of the heat sink.

An alternate configuration of the hybrid heat sink is shown in FIG. 2. This configuration of the hybrid heat sink could be manufactured by drilling holes 80, 82, 84, and 86 through the body of the hybrid heat sink 20 in a common plane in a direction parallel to the attaching surface of the electronic component 14 with fittings 60, 62, 64, 66, 68, 70, 72, and 74 attached by brazing or welding. Flexible tubing 90 is then attached to the fittings, thereby allowing a path for the fluid to flow through the hybrid heat sink 20.

The holes are shown as having a major axis perpendicular to two opposite faces 76a and 76b of the hybrid heat sink 20 However, the holes could be drilled such that the major axis is not perpendicular to opposite faces 76a and 76b of heat sink 20. In addition, the holes could be drilled such that the major axes of holes 80, 82, 84, and 86, are not perpendicular to the same plane.

Figure 3:
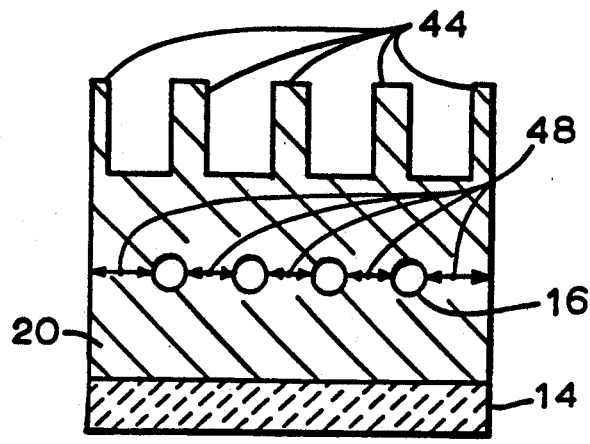
FIG. 3 is a cross sectional view of the heat sink of FIG. 1, taken along the plane of line 3—3 of FIG. 1.

Referring now to FIG. 3, the serpentine path taken by the cavity is arranged such that the distance 48 between the sections of the cavity is sufficient to allow heat to be conducted to the top surface of the hybrid heat sink 20, while allowing sufficient cavity space for sufficient internal circulation of the fluid and for heat transfer to the fluid. This is necessary, because, in event of the failure of the pump, the liquid would cease to flow. Liquid which is not flowing has poor thermal conductivity and operates as a thermal barrier. If the distance 48 is not sufficient to allow heat to be conducted to the top surface of the hybrid heat sink 20, non-moving liquid in the cavity could prevent the heat from being conducted to the fins 44 on the top surface of the hybrid heat sink 20, where the cooling air can remove the heat.

Figure 4:
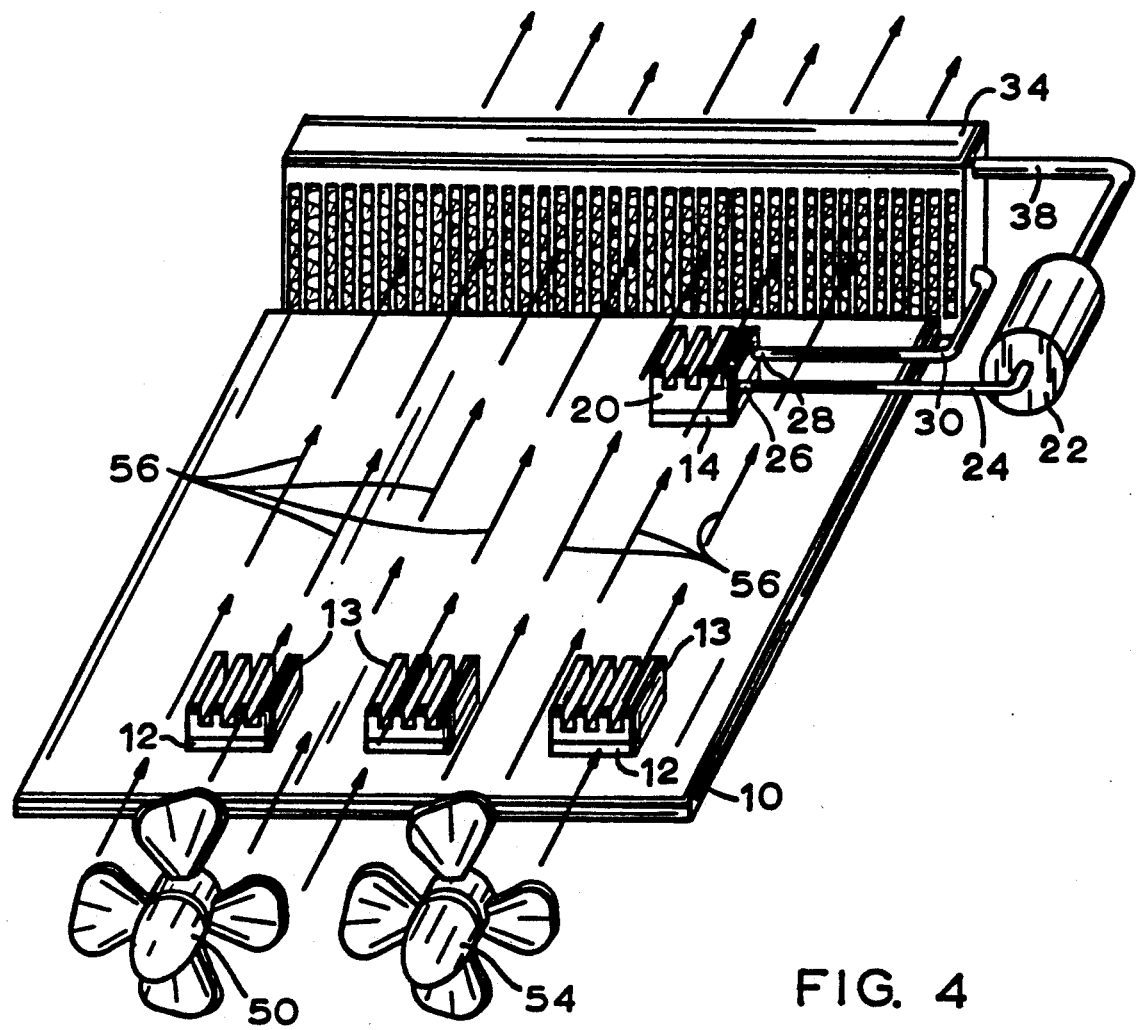
FIG. 4 is a perspective view of a circuit board cooled in accordance with the invention.

In FIG. 4, a circuit board 10 has placed on it electronic components 12 which produce heat. Each of these components 12 may be provided with an attached conventional heat sink 13. Also placed on the circuit board is a component 14 which produces more heat than any one of components 12. Attached to component 14 is a hybrid heat sink 20. As shown in FIG. 4, circuit board 10, electronic components 12, heat sinks 13, electronic component 14, and hybrid heat sink 20 may be a computer.

A fan 50 causes airflow 56 to circulate over circuit board 10, removing heat from electronic components 12 and the hybrid heat sink 20.

The airflow 56 caused by fan 50 is sufficient to cool electronic components 12 to within the normal operating range. Additionally, airflow 56 caused by fan 50 is sufficient to cool electronic component 14 to less than its maximum operating temperature.

Calculation of the airflow 56 necessary to cool electronic components 12 to within the normal operating range and to cool electronic component 14 to less than maximum operating temperature, is dependent on the amount of heat produced by the electronic components 12 and the electronic component 14, the temperature of the cooling gas, the surface area of the heat sink, and other factors pertaining to specific heat sink designs; such calculation being familiar to persons skilled in the art.

A pump 22 causes a cooling liquid to flow through tubing 24 to hybrid heat sink 20. Tubing 24 may be metal or, preferably of a resilient material such as rubber or polyethylene; the tubing must not be subject to corrosion by the cooling liquid and must remain resilient and retain structural integrity at temperatures up to the boiling point of the cooling fluid. The tubing 24 is force fit onto fittings 26 and 28, and may be secured by conventional pressure fittings. The cooling liquid may be water, but preferably is a liquid that has a boiling point higher than the maximum operating temperature of the electronic component 14. Several of the fluorinated organic compounds which is available from the 3M Corporation of St. Paul, Minn., under the trademark "Fluorinert", are suitable liquid coolants. Fluorinert FC-40, FC-43, FC-5311, FC-70, FC-5312, and FC-71 all have boiling points greater than 215 degrees Celsius. This temperature is well above the maximum operating temperature of most chips, which is approximately 125 degrees. The Fluorinert family of electronic liquids is described in 3M Industrial Products Division 98-0211-

4322-1(18.5)GNP, available from 3M Industrial Products Division, Building 223-6S-04, 3M Center, St. Paul, Minn. 55144-1000.

A mixture of ethylene glycol and water is another liquid commonly used in liquid cooling systems. Ethylene glycol has a boiling point of approximately 105 degrees Celsius which is higher than the maximum operating temperature of some chips.

If the cooling liquid has a boiling point lower than the maximum operating temperature of the electronic component 14 and the cooling liquid ceases to flow due to some malfunction, the cooling liquid may begin to boil, and pressures may build up in the system. It may therefore be desirable to have a conventional pressure relief valve, not shown.

From the hybrid heat sink 20, the cooling liquid flows through tubing 30 to a radiator 34, which expends heat to the surrounding environment. From the radiator 34, the cooling liquid flows through tubing 38 to the pump 22.

Although FIG. 4 is shown with the cooling liquid circulated to only one hybrid heat sink, it will be apparent to those skilled in the art that the cooling liquid could be circulated to more than one hybrid heat sink.

Figure 5:
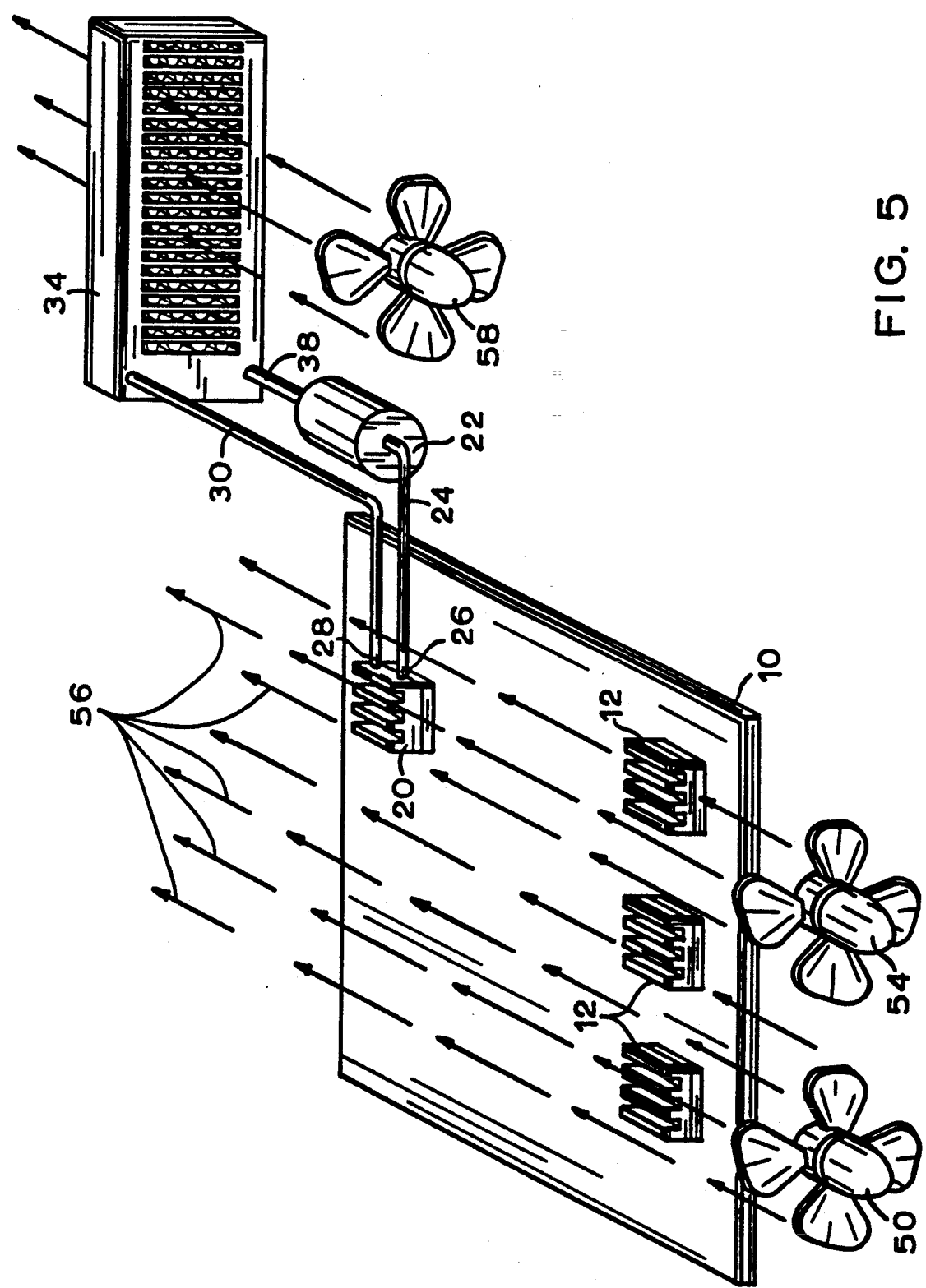
FIG. 5 is a perspective view of a circuit board cooled in accordance with the invention, with an alternate method of cooling the heat exchanger.

Referring now to FIG. 5, an alternate design is shown. Physical design constraints may make it inconvenient to place the radiator 34 at a location such that it can be cooled by airflow 56 created by fans 50 and 54. In this case an additional fan 58 cools the radiator.

Figure 6:
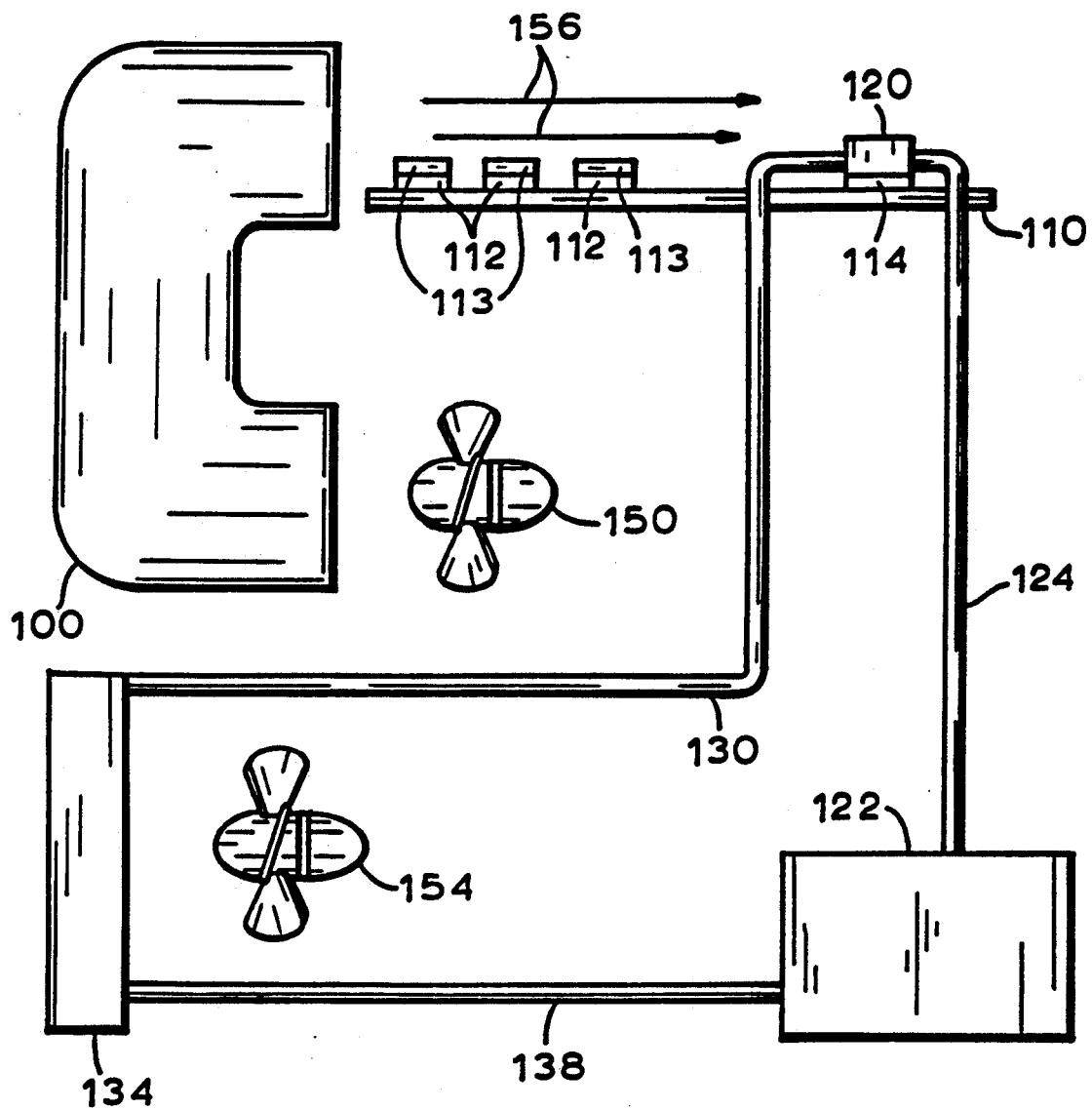
FIG. 6 is a diagrammatic cross sectional view of the preferred embodiment of the invention.

FIG. 6 shows the preferred embodiment. A circuit board 110 has placed on it electronic components 112 which produce heat. Each of these components 112 may provided with an attached conventional heat sink 113. Also placed on the circuit board is a component 114 which produces more heat than any one of components 112. Attached to component 114 is a hybrid heat sink 120.

A fan 150 causes cooling air to flow through duct 100 to circuit board 110, removing heat from electronic components 112 and the hybrid heat sink 120.

The airflow 156 caused by fan 150 is sufficient to cool electronic components 112 to within the normal operating range. Additionally, airflow 156 caused by fan 150 is sufficient to cool electronic component 114 to its maximum operating temperature or lower.

Calculation of the airflow 156 necessary to cool electronic components 112 to within the normal operating range and to cool electronic component 114 to less than maximum operating temperature, is dependent on the amount of heat produced by the electronic components 112 and the electronic component 114, the temperature of the cooling gas, the surface area of the heat sink, and other factors pertaining to specific heat sink designs; such calculation being familiar to persons skilled in the art.

A pump 122 causes a cooling liquid to flow through tubing 124 to hybrid heat sink 120. Tubing 124 be metal or, preferably of a resilient, heat resistant material such as rubber or polyethylene; the tubing must not be subject to corrosion by the cooling liquid and must remain resilient and retain structural integrity at temperatures up to the boiling point of the cooling fluid. The tubing 124 is force fit onto fittings (not show) as in other embodiments of the invention, and may be secured by conventional pressure fittings. The cooling liquid may be water, but preferably, as described in other embodiments, is a liquid that has a boiling point higher than the maximum operating temperature of the electronic component 114.

If the cooling liquid has a boiling point lower than the maximum operating temperature of the electronic component 114 and the cooling liquid ceases to flow due to some malfunction, the cooling liquid may begin to boil, and pressures may build up in the system. It may therefore be desirable to have a conventional pressure relief valve, not shown.

From the hybrid heat sink 120, the cooling liquid flows through tubing 130 to a radiator 134, which in conjunction with fan 154, expends heat to the surrounding environment. From the radiator 134, the cooling liquid flows through tubing 138 to the pump 122.

Although FIG. 6 is shown with the cooling liquid circulated to only one hybrid heat sink, it will be apparent to those skilled in the art that the cooling liquid could be circulated to more than one hybrid heat sink.

The invention having thus been described, it will be apparent to those skilled in the art that the invention may be practiced in many ways other than as specifically described, while remaining within the spirit and scope of the invention as described in the appended claims.

We claim:

1. An electrical apparatus comprising:
    a circuit board;
    a heat generating electronic component mounted on said circuit board, said electronic component having a maximum operating temperature, said electronic component having a substantially planar surface; and
    a heat sink composed of a thermally conductive material, said heat sink having:
        a first exterior surface mounted on and in thermal contact with said substantially planar surface of said electronic component;
        a second exterior surface opposite said first surface and comprising spaced apart heat dissipation members for thermal contact by a cooling gas; an internal cavity to conduct a flow of cooling liquid;
        said heat sink providing conductive paths from said electronic component to said cooling gas and said cooling liquid;
    means for containing and directing flow of said cooling liquid to and from said internal cavity of said heat sink sufficient to cool said electronic component to at least said maximum operating temperature;
    means for circulating said cooling gas over said spaced apart heat dissipation members of said heat sink; and
    said heat sink and said internal cavity being configured and dimensioned relative to the flow of said cooling gas for enabling said cooling gas, alone, to cool said electronic component at least to said maximum operating temperature.

2. An electrical apparatus according to claim 1, wherein said planar surface of said electronic component and said first exterior surface of said heat sink are rectangular surfaces having sides of approximately equal length.

3. An electronic device comprising:
    a heat generating electronic component having a maximum operating temperature, said electronic component mounted on a circuit board and having a substantially planar external surface spaced from said circuit board;

a heat sink comprising thermally conductive material, said heat sink including:

a first planar surface in thermal transfer contact with said substantially planar external surface of said electronic component whereby said electronic component is positioned between said heat sink and said circuit board;

a second surface opposed to said first surface and incorporating a plurality of spaced apart heat transfer fins extending transversely of said first planar surface; and an internal fluid flow path;

means for directing a forced flow of gaseous cooling fluid through said heat transfer fins effective to cool said electronic component below said maximum operating temperature;

and means operable independently of said means for directing a forced flow of gaseous cooling fluid, for providing a flow of cooling liquid through said internal fluid flow path of said heat sink effective to cool said electronic component below said maximum operating temperature, said cooling liquid having a boiling point significantly higher than said maximum operating temperature.

4. An electronic device according to claim 3, wherein said means for directing a flow of cooling fluid comprises an air circulator.

5. An electronic device according to claim 3, wherein said maximum operating temperature is about 125° C.

6. An electronic device according to claim 3, wherein said fins are parallel, spaced apart fins.

7. An electronic device according to claim 3, wherein said internal fluid flow path is a serpentine path.

8. An electronic apparatus comprising:

a plurality of heat generating electronic components mounted on a common circuit board, each said electronic component having individual maximum operating temperatures, said electronic component having a substantially planar external surface;

for each said electronic component, an individual heat sink comprising thermally conductive material, each said heat sink including:

a first planar surface in thermal transfer contact with said substantially planar external surface of a respective one of said electronic components whereby said electronic component is located between said heat sink and said circuit board;

a second surface opposed to said first surface and incorporating a plurality of spaced apart heat transfer fins extending transversely of said first planar surface;

at least one of said individual heat sinks further including an internal fluid flow path, said at least one heat sink having a first planar surface in thermal transfer contact with one of said electronic components operable to generate more heat than other ones of said electronic components;

means for directing a forced flow of gaseous cooling fluid through said heat transfer fins of all of said heat sinks effective to cool each said electronic component below its said maximum operating temperature; and means operable independently of said means for directing a flow of gaseous cooling fluid, for providing a flow of cooling liquid through said internal fluid flow path of said at least one heat sink effective to cool said electronic component generating more heat, below said maximum operating temperature, said cooling liquid having a boiling point significantly higher than said maximum operating temperature of said one electronic component.

9. An electrical apparatus according to claim 8, wherein said planar external surface of each said electronic component and said first planar surface of the respective heat sink in contact therewith are rectangular surfaces having sides of approximately equal length.

10. An electronic apparatus according to claim 8, wherein said means for directing a flow of gaseous cooling fluid comprises a plurality of air circulation fans.

11. An electronic apparatus according to claim 9, wherein said maximum operating temperature is about 125° C.

12. An electronic device comprising a heat generating electronic component mounted on a circuit board and having a substantially planar external surface spaced from said circuit board, said substantially planar external surface attached in thermal transfer contact to a substantially planar surface of a hybrid, block-shaped heat sink, said heat sink including an internal fluid flow path extending in a plane parallel to and over the area of said planar surface of said heat sink, said heat sink also including external, spaced apart heat dissipation members; said electronic component having a maximum operating temperature; a pump, operable to provide cooling liquid flow along said internal fluid flow path sufficient to cool said electronic component below said maximum operating temperature, said cooling liquid having a boiling point significantly higher than 125° C.; said electronic component having a maximum operating temperature not exceeding 125° C; and a circulator positioned to create gaseous cooling fluid flow over said heat dissipation members sufficient to cool said electronic component to a temperature below said maximum operating temperature, said circulator operable independently of said pump to effect said cooling of said electronic component even when said pump is not in operation.

* * * * *